United States Patent
Wang et al.

(10) Patent No.: US 7,183,617 B2
(45) Date of Patent: Feb. 27, 2007

(54) MAGNETIC SHIELDING FOR MAGNETICALLY SENSITIVE SEMICONDUCTOR DEVICES

(75) Inventors: Chao-Hsiung Wang, Hsin-Chu (TW); Horng-Huei Tseng, Hsinchu (TW); Denny Tang, Saratoga, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/060,000

(22) Filed: Feb. 17, 2005

(65) Prior Publication Data

US 2006/0180880 A1   Aug. 17, 2006

(51) Int. Cl.
*H01L 27/14* (2006.01)

(52) U.S. Cl. ............... 257/414; 257/659; 257/660; 257/667; 257/678

(58) Field of Classification Search .......... 438/275, 438/257; 257/414, 659, 660, 667, 678–796
See application file for complete search history.

(56) References Cited

U.S. PATENT DOCUMENTS

| | | | |
|---|---|---|---|
| 5,939,772 A * | 8/1999 | Hurst et al. ............ | 257/659 |
| 6,717,241 B1 | 4/2004 | Tuttle ................... | 257/659 |
| 2003/0052340 A1* | 3/2003 | Tuttle ................... | 257/200 |
| 2004/0152261 A1* | 8/2004 | Spencer et al. ........ | 438/257 |
| 2005/0116255 A1* | 6/2005 | Kato et al. ............. | 257/200 |
| 2006/0019422 A1* | 1/2006 | Tuttle et al. ........... | 438/55 |

\* cited by examiner

*Primary Examiner*—Andy Huynh
*Assistant Examiner*—Tram H. Nguyen
(74) *Attorney, Agent, or Firm*—Preston Gates & Ellis LLP

(57) ABSTRACT

A magnetic shielding device is provided for protecting at least one magnetically sensitive component on a substrate according to embodiments of the present invention. The device comprises a first shield having a top portion, and one or more side portions, wherein the top and side portions along with the substrate encloses the magnetic sensitive component within for protecting the same from an external magnetic field, and wherein the magnetic shielding device contains at least two magnetic shielding materials with one having a relatively higher magnetic permeability property but lower magnetic saturation property while the other having a relatively lower magnetic permeability property but higher magnetic saturation property.

18 Claims, 4 Drawing Sheets

MAGNETIC SHIELDING FOR MAGNETICALLY SENSITIVE SEMICONDUCTOR DEVICES

BACKGROUND

The present invention relates generally to integrated circuits (ICs), and more particularly to a system to improve magnetic shielding for IC chips and packages containing magnetically sensitive components.

Computers benefited from magnetic memories before semiconductor integrated circuit (IC) memory chips were available. Magnetic fields from currents in hand-woven wires stored binary data in the magnetic state of ferrite rings. However, the importance of magnetic memories has diminished when semiconductor ICs, which store orders of magnitude more data in orders of magnitude smaller structures with orders of magnitude greater speed, rose to prominence.

Recent discoveries have enabled the combination of semiconductor and magnetic data storage techniques, in IC memories such as magnetic random access memories (MRAMs). MRAM is a type of non-volatile memory with fast programming time and high density. When designed properly, MRAM provides a viable alternative to generic semiconductor ICs. However, these magnetic memories are susceptible to time-varying magnetic fields generated by some components in operating environments where significant power and current levels are required.

The shielding of IC chips, especially devices such as magnetic memories, from magnetic fields is therefore critical. A magnetic field can be viewed as a plurality of continuous, closed loops of field lines, which can be diverted by a magnetic shield. The magnetic shield can only protect an magnetically sensitive component inside it from external magnetic fields by collecting and concentrating an external magnetic field within the wall or shell of itself. In other words, a magnetic shield diverts a portion of loops or field lines to run within itself and therefore around a protected magnetically sensitive component.

Desirable in the art of IC designs are additional systems and methods that can improve magnetic shielding for IC chips and packages.

SUMMARY

In view of the foregoing, a system is disclosed to improve magnetic shielding for IC chips and packages.

A magnetic shielding device is provided for protecting at least one magnetically sensitive component on a substrate according to embodiments of the present invention. The device comprises a first shield having a top portion, and one or more side portions, wherein the top and side portions along with the substrate encloses the magnetic sensitive component within for protecting the same from an external magnetic field, and wherein the magnetic shielding device contains at least two magnetic shielding materials with one having a relatively higher magnetic permeability property but lower magnetic saturation property while the other having a relatively lower magnetic permeability property but higher magnetic saturation property.

The construction and method of operation of the invention, however, together with additional objects and advantages thereof will be best understood from the following description of specific embodiments when read in connection with the accompanying drawings.

DESCRIPTION

The invention provides various magnetic shield structures for protecting magnetically sensitive semiconductor components or chips. Examples of the magnetically sensitive devices to be protected from magnetic fields include a radio frequency (RF) circuit, a magnetic random access memory (MRAM) array, microelectromechanical systems (MEMS), and magnetic sensors. As it is known in the industry, a magnetic shielding mechanism is used for protecting magnetically sensitive components on a semiconductor substrate. The magnetic shielding mechanisms can be incorporated regardless of what particular packaging technology is used. For example, semiconductor chip packages may include QFP, CSP, PBGA, BGA, CPGA, PBGA module, MCM module, multi-chip on one board, and stacked die.

A magnetic shield's ability to protect an magnetically sensitive component is determined by its permeability, which is a measure of the ability of a magnetic shield material to concentrate magnetic field lines within itself, and its saturation, which is a measure of the maximum ability of a magnetic shield material to concentrate magnetic field lines. Examples of magnetic shield materials include ferrites, manganites, chromites, cobaltites, iron (Fe), magnesium (Mg), manganese (Mn), nickel (Ni), copper (Cu), cobalt (Co), and alloys thereof. The magnetic shield material may includes a matrix that can be a polymer such as epoxy, FR-4, Kapton, and other resins. The matrix may have an amorphous phase. The magnetic shield material can also include a dielectric such as silica, alumina, and low-temperature co-fired ceramic (LTCC).

A magnetically-inert layer may be placed between the shield and the magnetically sensitive component to be protected. As will be explained more below, the present invention prefers to have two or more layers or types of materials to be used for the protection mechanism, the outer layer may have the relatively higher saturation property, and the relatively lower permeability property. The permeability of a given material also varies with particle size, generally diminishing with increasing particle size. So, there is a preferred practical range of particle sizes.

Figure 1:
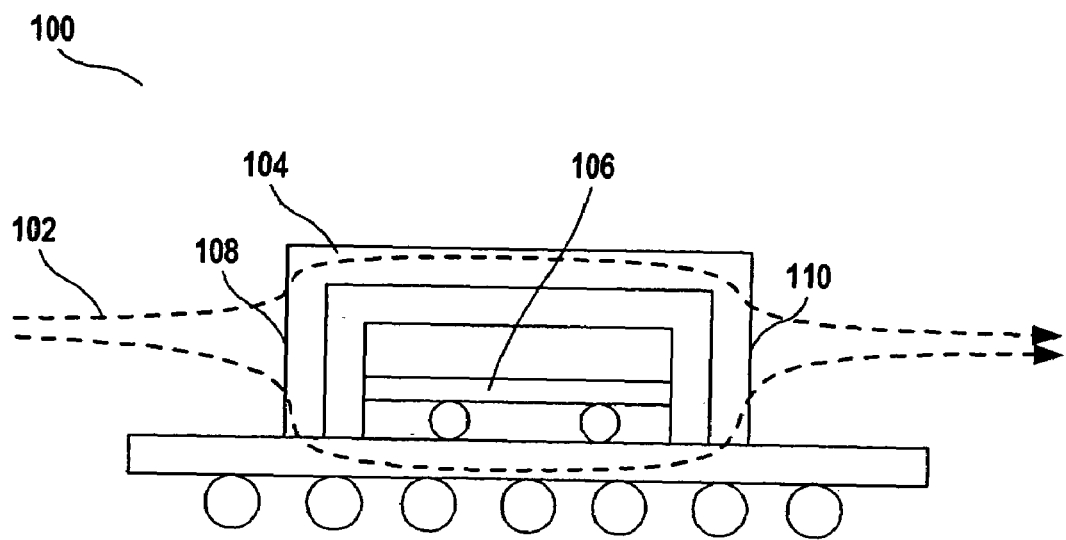
FIG. 1 illustrates a magnetic shield structure.

It is possible to construct effective magnetic shielding for magnetically sensitive devices, such as an MRAM unit. In FIG. 1, a cross section 100 illustrates the function of magnetic shielding according to one embodiment of the present invention. The dashed lines represent magnetic field lines 102 of the external magnetic field. The magnetic shield 104 is shown as a box having a solid or mesh surface (could be a solid one or a mesh type) that envelopes a magnetically sensitive component 106 such as an MRAM unit that is to be protected from external magnetic fields. The top and two vertical sides of the magnetic shield 104 are shown to close the space all the way to the surface of the substrate. The front and back sides are parallel to the page and are not shown as this is only a cross sectional view. The magnetic shield 104 does not function by excluding a magnetic field from itself, but rather by collecting and concentrating the magnetic field lines 102 into itself and thereby diverting the field around the magnetically sensitive component to be protected. The magnetic shield 104 is designed to have side pieces so that it is continuous in form. This attribute has value since the continuity helps the magnetic shield 104 to conduct the field smoothly without losses at edges. If there are no side pieces, the external magnetic fields will affect certain areas of the component 106 from the open edge or sides of the shield 104. The affecting depth, the space distance of the component that is subject to the influence of the magnetic field, needs to be as small as possible. The magnetic field lines 102 enter the magnetic shield 104 near an area 108, exit near an area 110, loop back through the source magnet, not shown, and loop back to form a closed loop where they enter near the area 108 of the magnetic shield 104. Since the magnetic field lines 102 are concentrated within the magnetic shield 104, the magnetically sensitive component 106 is protected from magnetic interference.

The effectiveness of magnetic shielding can be measured and specified conveniently in terms of decibels (dB), similarly as sound deadening is specified. The ratio of the magnetic field strength outside of the magnetic shield to the magnetic field strength inside the magnetic shield is labeled S, the shielding factor, which is preferred to be represented in terms of dB value, wherein the dB value equals to 20 log S. A typical desired shielding factor, S, is in the range of 10 to 50 dB, which typically determines a practical thickness of the shield with a range of 0.12 to 12 microns.

Figure 2:
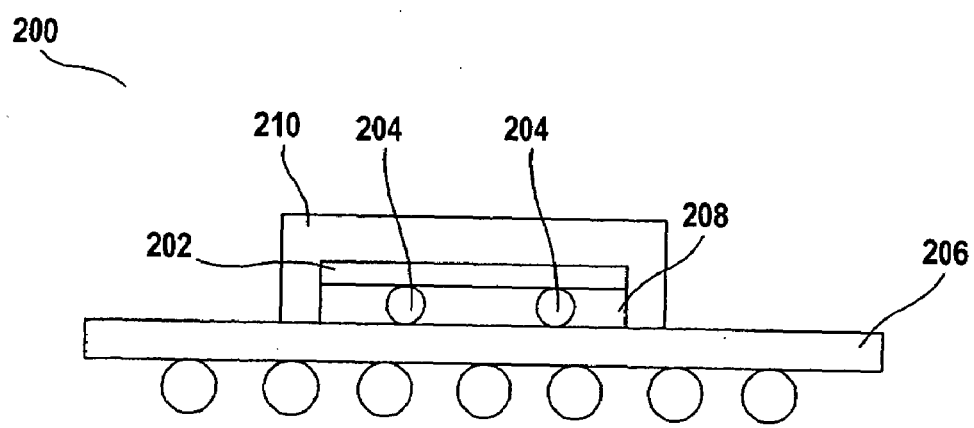
FIGS. 2 to 5 illustrate magnetic shield structures for magnetically sensitive semiconductor chips in accordance with four embodiments of the present invention.

In FIG. 2, a cross section 200 illustrates a device 202, shown as a flip-chip, mounted with solder balls 204 on a substrate 206 in accordance with one embodiment of the present invention. The space under the device 202, around the solder balls 204, is typically filled with an inert material 208, in order to exclude moisture and other contaminants. The inert material 208 is typically selected to be electrically insulating and thermally conducting. If the device 202 is not a flip-chip, then the wire leads that replace the solder balls 204 are typically coated with a material similar to the inert material 208 for the same purposes. A magnetic shield 210 is coated over, and in contact with, the exposed surface of the device 202.

The magnetic shield 210 contains particles of at least two types of magnetic shielding material. For instance, the first type of particles, A, has a relatively higher magnetic saturation property and a relatively lower magnetic permeability property. The second type of particle, B, has a relatively lower magnetic saturation property and a relatively higher magnetic permeability property. The mixture of the two types of particles, in a magnetically-inert matrix, functions as a magnetic shield with a beneficial, synergistic mixture of properties. The first type of particle saturates at a relatively strong magnetic field, but the concentration is not relatively great. The second type of particle saturates at a lower magnetic field strength, but more strongly concentrates the field.

Figure 3:
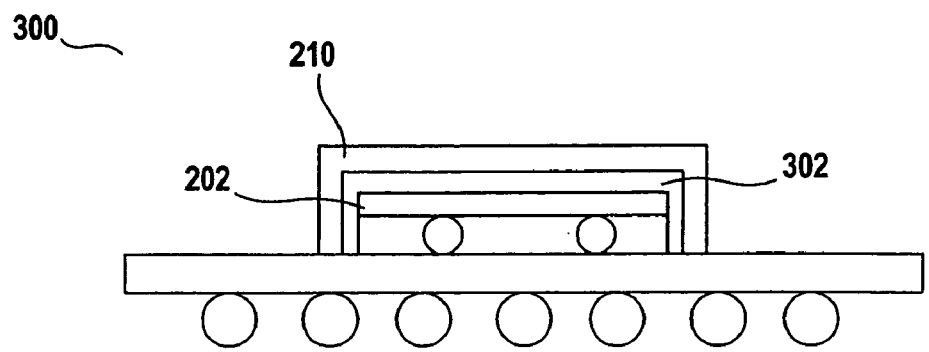

In FIG. 3, a cross section 300 is similar to the cross section 200 in FIG. 2, but with the option of an extra layer between the magnetically sensitive component 202 and the magnetic shield 210 in accordance with another embodiment of the present invention. The extra layer is a magnetically-inert material 302 that is electrically insulating and thermally conducting, such as zinc sulfide (ZnS).

Figure 4:
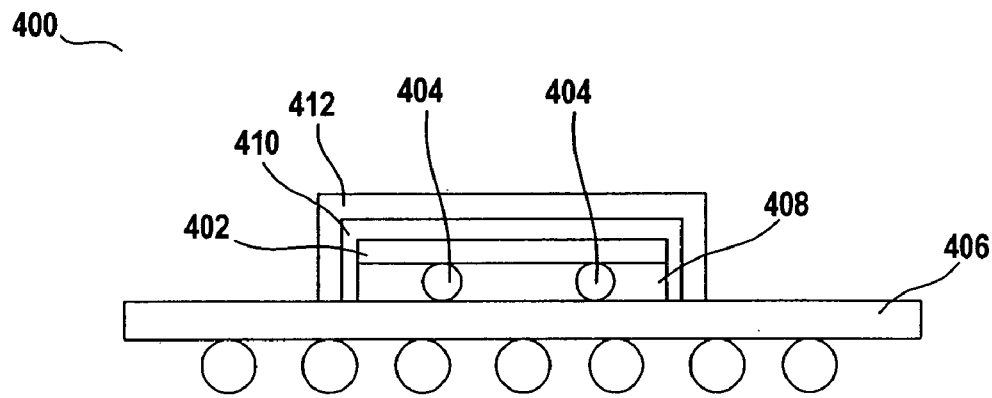

In FIG. 4, a cross section 400 illustrates a magnetically sensitive component 402, shown as a flip-chip, mounted with solder balls 404 on a substrate 406 in accordance with yet another embodiment of the present invention. The space under the device 402, around the solder balls 404, is typically filled with an inert material 408, in order to exclude moisture and other contaminants. The inert material 408 is typically selected to be electrically insulating and thermally conducting. If the device 402 is not a flip-chip, then the wire leads that replace the solder balls are typically coated with a material similar to the inert material 408 for the same purposes. A beneficial structure for magnetic shielding is composed of at least two magnetic shield layers. A first magnetic shield 410 is coated over, and in contact with, the exposed surface of the flip-chip 402. A second magnetic shield 412 is coated over, and in contact with, the first magnetic shield 410. In some cases, there can be more magnetic shields. The first magnetic shield 410 has a relatively lower magnetic saturation property and a relatively higher magnetic permeability property, μ. The second magnetic shield 412 has a relatively higher magnetic saturation property and a relatively lower magnetic permeability. The second magnetic shield 412 protects the inner magnetic shield 410 from magnetic saturation.

Figure 5:
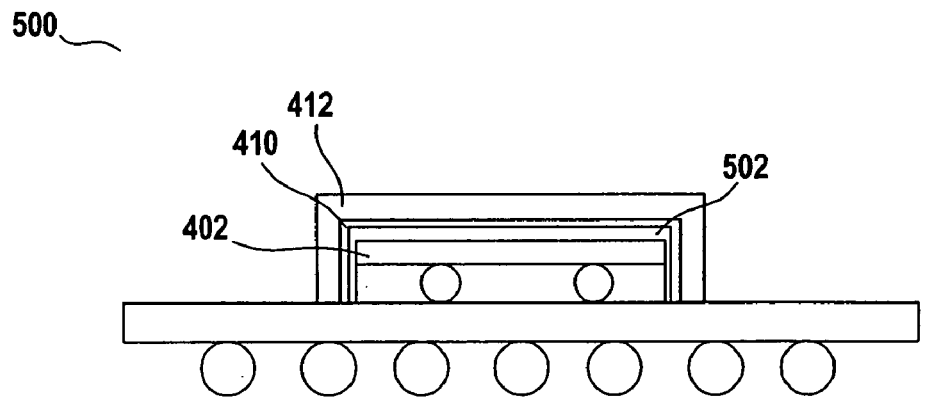

In FIG. 5, a cross section 500 is similar to the cross section in FIG. 4, but with the option of an extra layer between the device 402 and the magnetic shield 410, which is coated by the magnetic shield 412 in accordance with yet another embodiment of the present invention. The extra layer is a magnetically-inert material 502 that is electrically insulating and thermally conducting, such as zinc sulfide (ZnS).

Figure 6:
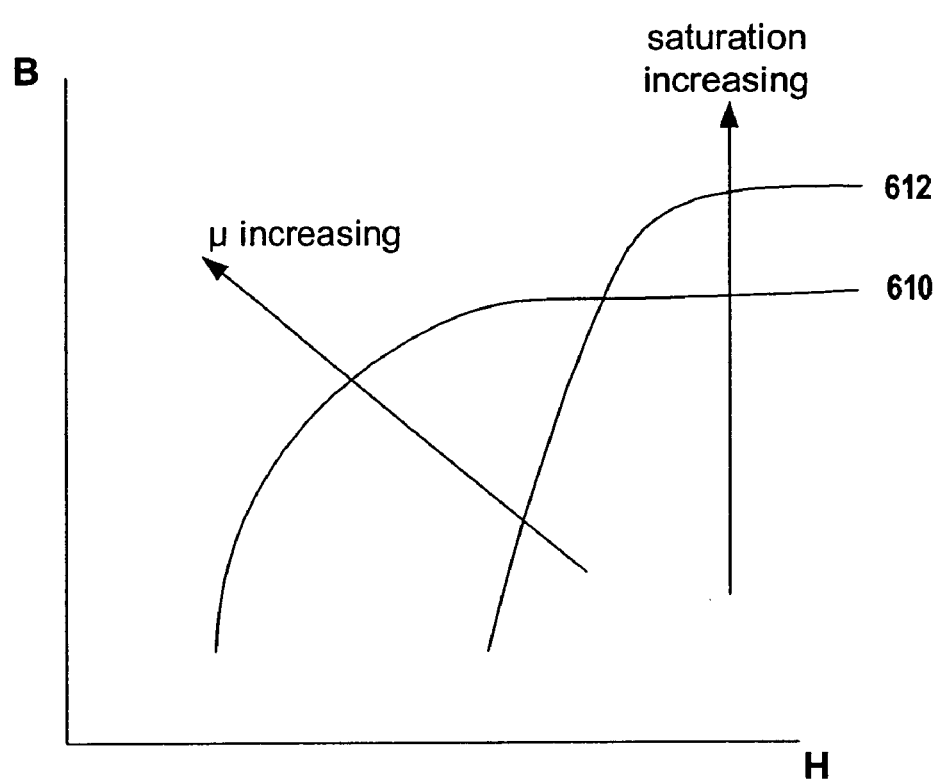
FIG. 6 illustrates the magnetic saturation and permeability properties of different magnetic shield alloys useful in the present invention.

In FIG. 6, a graph 600 illustrates the magnetic saturation and magnetic permeability properties of two types or layers of magnetic material used for magnetic shields. It is understood that the shield can be made of two different layers, each containing a different material, it can also be made of one layer with an alloy containing particles of two types of magnetic materials. Further, it can also be that two separate layers are used for the shield, each layer having the alloy. In FIG. 6, the horizontal axis H is the external magnetic field strength, while the vertical axis B is the magnetic field within the shield material. The magnetic shield 610 represents the inner magnetic shield and it has a relatively lower magnetic saturation property and a relatively higher magnetic permeability property. The magnetic shield 612 is the outer magnetic shield and it has a relatively higher magnetic saturation property and a relatively lower magnetic permeability property. In the situation where only one layer of magnetic shield is used, but it has two different types of magnetic materials, the curves 610 and 612 represent the magnetic shielding performance of the two materials.

Figure 7:
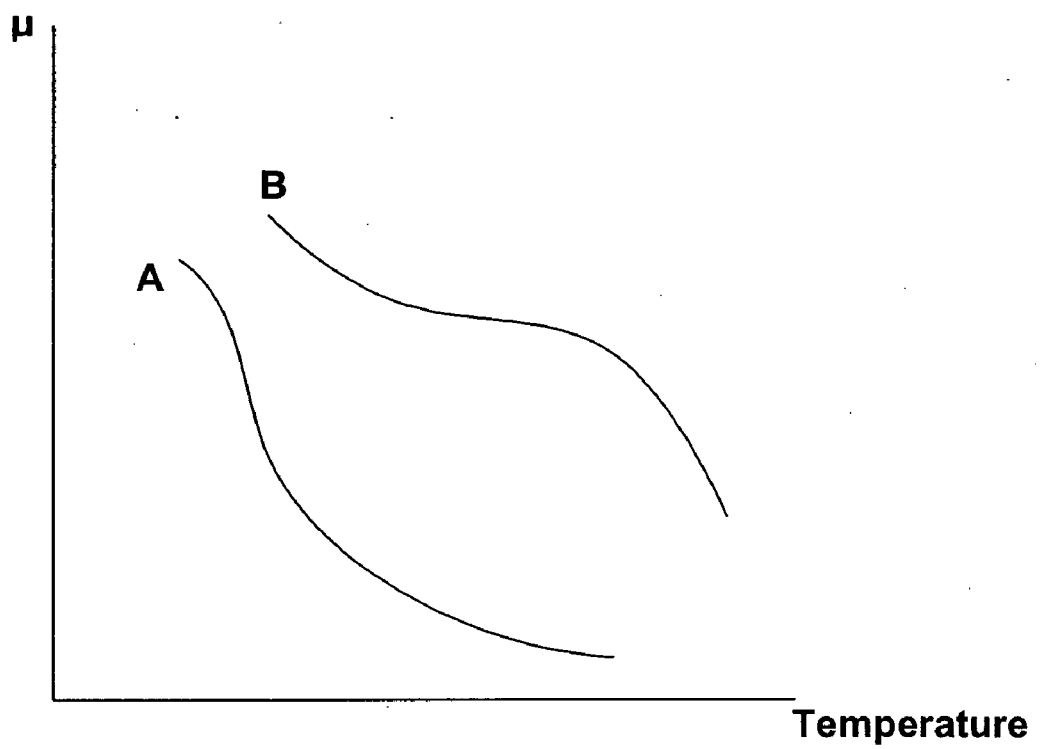
FIG. 7 illustrates the permeability properties of different magnetic shield alloys according to particle size.

The magnetic shield contains particles of magnetic shielding material, and the size of these particles affects the performance of the magnetic shield. In general, when the particles are very small in size, the atomic arrangement of them are relatively tight and hard to be affected by external magnetic field. Therefore, it is preferred that the size ranges from 40 nanometers (nm) to 1500 nm. In fact, when two or more materials are used, the particle sizes may be different from each other. The magnetic permeability of a given magnetic shielding also varies with temperature, as is shown in FIG. 7. In FIG. 7, two different alloy materials A and B have different magnetic permeability performance at similar temperatures. Although the magnetic shield is also a factor to be considered for the thermal dissipation of the magnetic sensitive component shielded by it, percentage contents of various types of materials in the alloy may be considered to provide the best shielding performance. For example, a change of 0.25% of nickel content in a metal alloy can cause a change of 10 C in Curie temperature.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A magnetic shielding device for protecting at least one magnetically sensitive component on a substrate, the device comprising:
    a first shield having a first top portion, and one or more first side portions, wherein the first top and first side portions along with the substrate entirely enclose the magnetic sensitive component within for protecting the same from an external magnetic field, and
    a second shield having a second top portion, and one or more second side portions, wherein the second top and second side portions along with the substrate entirely enclose the first shield without any gap there between;
    wherein the magnetic shielding device contains at least two magnetic shielding materials with one having a relatively higher magnetic permeability property but lower magnetic saturation property while the other having a relatively lower magnetic permeability property but higher magnetic saturation property.

2. The device of claim 1 wherein the magnetic sensitive component is an magnetic random access memory device.

3. The device of claim 1 wherein the magnetic shielding materials have a particle size ranging from 40 nm to 1500 nm.

4. The device of claim 3 wherein the two magnetic shielding materials have two different particle sizes.

5. The device of claim 1 wherein the second shield has a higher magnetic saturation property than that of the first shield.

6. The device of claim 5 wherein the second shield has a lower magnetic permeability property than that of the first shield.

7. The device of claim 1 further comprising a magnetic-inert layer underlying the first shield.

8. The device of claim 1 wherein the first and second shields provide a magnetic shielding factor of about 10 to 50 dB.

9. The device of claim 1 wherein the first shield provides a magnetic shielding factor of about 10 to 50 dB.

10. The device of claim 1 wherein the first shield has a thickness ranging from 0.12 um to 12 um.

11. The device of claim 1 further comprising a non-magnetic shield material between the magnetically sensitive component and the first shield.

12. A magnetic shielding device for protecting at least one magnetically sensitive component on a substrate, the device comprising:
    a first shield having a first top portion, and one or more first side portions, wherein the first top and first side portions along with the substrate entirely enclose the magnetic sensitive component within for protecting the same from an external magnetic field;
    a second shield having a second top portion and one or more second side portions entirely enclosing the first shield therein without any gap there between; and
    a magnetic-inert layer underlying the first shield.

13. The device of claim 12 wherein the second shield has a relatively higher magnetic permeability property but lower magnetic saturation property while the first shield has a relatively lower magnetic permeability property but higher magnetic saturation property.

14. The device of claim 12 wherein the magnetic sensitive component is a magnetic random access memory device.

15. The device of claim 12 wherein the first and second shields have a total thickness ranging from 0.12 um to 12 um.

16. A magnetic shielding device for protecting at least one magnetically sensitive component on a substrate, the device comprising:
    a first shield composed of a first shielding material, having a first top portion, and one or more first side portions, wherein the first top and first side portions along with the substrate entirely enclose the magnetic sensitive component within for protecting the same from an external magnetic field;
    a second shield composed of a second shielding material, having a second top portion, and one or more second side portions, wherein the second top and second side portions along with the substrate entirely enclose the first shield without any gap there between;
    wherein the first shielding material has a relatively higher magnetic permeability property but lower magnetic saturation property while the second shield material has a relatively lower magnetic permeability property but higher magnetic saturation property,
    wherein the first and second shields provide a magnetic shielding factor of about 10 to 50 dB, and
    wherein the first and second magnetic shielding materials have a particle size ranging from 40 nm to 1500 nm.

17. The device of claim 16 wherein the first magnetic shielding material and the second magnetic shielding material have two different particle sizes.

18. The device of claim 16 further comprising a non-magnetic shield material between the magnetically sensitive component and the first shield.

* * * * *